United States Patent
Jalan et al.

(10) Patent No.: US 9,287,876 B1
(45) Date of Patent: Mar. 15, 2016

(54) FULLY AUTOMATED. HIGH THROUGHPUT, CONFIGURABLE DIGITAL DESIGN INTERNAL FUNCTIONAL NODE PROBING MECHANISM AND METHOD

(71) Applicant: Texas Instruments Incorporated, Dallas, TX (US)

(72) Inventors: Saket Jalan, Bangalore (IN); Mohammed Nabeel, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/623,364

(22) Filed: Feb. 16, 2015

(51) Int. Cl.
*H03K 19/177* (2006.01)
*H03K 19/173* (2006.01)

(52) U.S. Cl.
CPC .... *H03K 19/17724* (2013.01); *H03K 19/17736* (2013.01); *H03K 19/1737* (2013.01)

(58) Field of Classification Search
CPC ............ H03K 19/177; H03K 19/1737; H03K 19/17724; H03K 19/17736
USPC ...................................... 326/38, 41
See application file for complete search history.

(56) References Cited

U.S. PATENT DOCUMENTS

| | | | | |
|---|---|---|---|---|
| 6,124,730 A * | 9/2000 | Agrawal | ............ | H03K 19/1737 326/38 |
| 7,185,035 B1 * | 2/2007 | Lewis | ...................... | G06F 7/501 708/235 |
| 7,653,891 B1 * | 1/2010 | Anderson | ............ | H03K 17/005 326/41 |
| 7,772,879 B1 * | 8/2010 | Feng | .................. | H03K 19/1737 326/38 |
| 9,117,022 B1 * | 8/2015 | Chiu | ...................... | G06F 13/364 |
| 2007/0022345 A1 * | 1/2007 | Smith | ............ | G01R 31/318385 714/734 |

* cited by examiner

*Primary Examiner* — Don Le
(74) *Attorney, Agent, or Firm* — Ronald O. Neerings; Frank D. Cimino

(57) ABSTRACT

A device includes a plurality of functional logic blocks, a cascaded arrangement of multiplexers and a digital counter. Each of the plurality of functional logic blocks outputs a signals corresponding to nodes to be tested therein. The cascaded arrangement of multiplexers are arranged such that any of the outputs from any of the plurality of functional logic blocks may be selected for output. The digital counter is operable to control the cascaded arrangement of multiplexers so as to output signals from the functional logic blocks based on a counted signal.

20 Claims, 4 Drawing Sheets

FULLY AUTOMATED. HIGH THROUGHPUT, CONFIGURABLE DIGITAL DESIGN INTERNAL FUNCTIONAL NODE PROBING MECHANISM AND METHOD

BACKGROUND

The present disclosure is generally drawn to an automated, system debug mechanism that can save time, labor, and reduce the risk of impacting the real functional state of the system.

In today's market, a typical system on chips (SoC) has thousands of debug nodes. During debugging, the user has to manually configure registers across the chip to bring out these nodes. Most often these registers are contained in different parts of the design, which makes this process extremely tedious and error prone. The configuration of the debug logic is also dependent on the system bus. This leads to a major concern of how to debug the system if the main processor gets stuck. An example debugging system will now be described with reference to FIG. 1 and FIG. 2.

FIG. 1 illustrates a prior art debug logic implementation 100.

As shown, FIG. 1 debug logic implementation 100 includes: a plurality of functional logic blocks, a sample of which are numbered as a functional logic block 102, a functional logic block 104, a functional logic block 106 and a functional logic block 108; a plurality of first-level multiplexers, a sample of which are numbered as a first-level multiplexer 110, a first-level multiplexer 112, a first-level multiplexer 114 and a first-level multiplexer 116; a plurality of second-level multiplexers, a sample of which are numbered as a second-level multiplexer 118 and a second-level multiplexer 120; a plurality of n-level multiplexers (not shown) represented by line 165; a plurality of $(n-1)^{th}$-level multiplexers, a sample of which is labeled $(n-1)^{th}$-level multiplexer 122, a bus matrix 156, a final-level multiplexer 166, an output pin 174, an output pin 176, an output pin 178, and a plurality of control registers, a sample of which are numbered 184, 186, 188, 190, 192, 194, 196 and 198.

Bus matrix 156 is arranged to output instructions to control registers 184-198.

Each of the plurality of functional logic blocks represent functional circuitry of a system that is to be tested. Each of the plurality of functional logic blocks has a plurality of outputs, each of which corresponds to a node within the functional logic block. As such, the voltage (or current as the case may be for a particular circuit type) at each node may output for monitoring. In this example, and for purposes of discussion, each functional logic block has 8 outputs, each corresponding to 1 of 8 nodes that may be monitored. Of course, the number of outputs and nodes is a function of the nodes for a particular system that is to be tested.

First functional logic block 102 is arranged to output data by way of a plurality of output lines, a sample of which have been numbered 124 and 126 to first-level multiplexer 110. Functional logic block 104 is arranged to output data by way of a plurality of output lines, a sample of which have been numbered 128 and 130 to first-level multiplexer 112. Functional logic block 106 is arranged to output data by way of a plurality of output lines, a sample of which have been numbered 132 and 134 to first-level multiplexer 114. Functional logic block 108 is arranged to output data by way of a plurality of output lines, a sample of which have been numbered 136 and 138 to first-level multiplexer 116.

There may be many functional logic blocks to debug. In this example, only four are shown for purposes of discussion.

To be able to access the output of any specific output for any specific functional logic block, the many outputs are cascaded through levels of multiplexers. The first level of multiplexers receives outputs directly from the functional blocks. The number of first-level multiplexers depends on the design of the debug system, which includes the pin number on each of the first-level multiplexers. For purposes of discussion, the multiplexers in this example have 8 inputs. As such, the number of multiplexers required to debug all outputs from all of the functional blocks are equal to one eighth the number of outputs for the functional blocks.

First-level multiplexer 110 is arranged to output data by way of line 140 to second-level multiplexer 118. First-level multiplexer 110 is additionally arranged to receive data from control register 184 by way of line 158. First-level multiplexer 112 is arranged to output data by way of line 142 to second-level multiplexer 118. First-level multiplexer 112 is additionally arranged to receive data from control register 186 by way of line 159. First-level multiplexer 114 is arranged to output data by way of line 146 to second-level multiplexer 120. First-level multiplexer 114 is additionally arranged to receive data from control register 188 by way of line 160. First-level multiplexer 116 is arranged to output data by way of line 148 to second-level multiplexer 120. First-level multiplexer 116 is additionally arranged to receive data from control register 190 by way of line 161

Additionally, items 115 and 117 represent a plurality of first-level multiplexers and functional logic components, which are not shown. In this example, since there are eight inputs going into each level multiplexers, items 115 and 117 would each represent six additional functional logic and multiplexer components.

As mentioned above, the outputs from the functional logic blocks are cascaded through levels of multiplexers. Also as mentioned, multiplexers in this example have 8 inputs. As such, each second-level multiplexer is "fed" by 8 first-level multiplexers. In this manner, a single second-level multiplexer is responsible for outputting a signal corresponding to 64 (i.e., 8×8) signals of functional logic blocks.

Second-level multiplexer 118 is arranged to receive data by way of a plurality of input lines, a sample of which have been numbered 140 and 142. Second-level multiplexer 118 is additionally arranged to receive data from control register 192 by way of line 162. Second-level multiplexer 118 is also arranged to output data by way of line 150 to $(n-1)^{th}$-level multiplexer 122. Second-level multiplexer 120 is arranged to receive data by way of a plurality of input lines, a sample of which have been numbered 146 and 148. Second-level multiplexer 120 is additionally arranged to receive data from control register 194 by way of line 163. Second-level multiplexer 120 is also arranged to output data by way of line 152 to $(n-1)^{th}$-level multiplexer 122.

Additionally, items 119 and 121 represent a plurality of second-level multiplexers, which are not shown. In this example, since there are eight inputs going into each level multiplexer, items 119 and 121 would each represent six additional functional logic and multiplexer components. Furthermore, item 123 represents the possible intermediate levels of multiplexers between the second-level multiplexers and the $(n-1)^{th}$-level multiplexers.

As mentioned, multiplexers in this example have 8 inputs. As such, 8 second-level multiplexers will feed a single third-level multiplexer (not shown), 8 third-level multiplexers (not shown) will feed a single fourth-level multiplexer (now shown), etc. An $n^{th}$-level multiplexer is "fed" by 8 $(n-1)^{th}$-level multiplexers. In this manner, the $n^{th}$-level multiplexer is responsible for outputting a signal corresponding to $8^n$ signals of functional logic blocks. In this example, the intermediate levels are not shown for purposes of brevity.

$(n-1)^{th}$-level multiplexer 122 is arranged to receive data by way of a plurality of input lines. $(n-1)^{th}$-level multiplexer 122 is additionally arranged to receive data from control register 196 by way of line 164. $(n-1)^{th}$-level multiplexer 122 is additionally arranged to output data by way of line 154 to an $n^{th}$-level multiplexer (not shown). Item 125 is shown to indicate additional $(n-1)^{th}$-level of multiplexers (not shown) to receive data from the $(n-2)^{th}$-level multiplexers.

Additionally, item 125 represents a plurality of $(n-1)^{th}$-level multiplexers, which are not shown. In this example, since there are eight inputs going into each level multiplexer, item 125 would represent seven additional functional logic and multiplexer components.

Final-level multiplexer 166 is arranged to receive data by way of a plurality of input lines. Final-level multiplexer 166 is additionally arranged to output data by way of a plurality of output lines, a sample of which have been numbered 168, 170, and 172 to output pin 174, output pin 176, and output pin 178, respectively Additionally, item 165 represents a plurality of $n^{th}$-level multiplexers, which are not shown. In this example, since there are eight inputs going into final-level multiplexer 166, there would be eight $n^{th}$-level multiplexers.

To begin debugging, instructions are fed into the system and onto bus matrix 156. Then the instruction would go to the corresponding multiplexer for the signal. For example, presume input signal 124 of functional block 102 is to be observed. Bus matrix 156 would send the instruction to control register 184. Then first-level multiplexer 110 receives the enable signal to select the input on line 124, which is then output to line 140.

Next, bus matrix 156 sends an instruction to program control register 192. Control register 192 enables the signal on line 140 to be selected, and second-level multiplexer 118 outputs the signal from line 140 to line 150. This cascading instruction set continues to the $n^{th}$ level of multiplexers, until it reaches the first input of final-level multiplexer 166. Control register 198 is then instructed to select the first input, and output to output pin 174, by way of line 168, wherein it may be read.

The conventional debugging scheme discussed above with reference to FIG. 1 is simple in its design. However, the programming of the individual control registers and implementation of the debugging method is more complicated and is susceptible to errors. This will be described in greater detail with reference to FIG. 2.

FIG. 2 illustrates a prior art programming path implementation 200 for programming a control register of FIG. 1.

As shown in FIG. 2, programming path implementation 200 includes functional logic block 102, first-level multiplexer 110, bus matrix 156, a Joint Test Action Group (JTAG) interface 202, a Central Processing Unit (CPU) 204, an arbitration logic 206, and a control register 184.

The operation of prior art programming path implementation 200 begins with JTAG interface 202. JTAG interface 202 is the standard test access port and boundary-scan architecture, which is widely used for integrated circuit debug ports. JTAG interface 202 is the mechanism used to access modules inside CPU 204. Once within CPU 204, there is arbitration logic 206 that needs to be accessed before sending instructions to bus matrix 156. Bus matrix 156 is used to transmit a wide array of information to control register 184. For example, bus matrix 156 would send an instruction to control register 184 to select input one. Control register 184 would pass this signal to first-level multiplexer 110, which would then select input one to pass to the output.

There exist a few major problems with the implementation path shown in FIG. 2.

First, there are several blocks that can potentially have a bug in silicon. Any link which fails in the path can render the complete path unusable, and the user will be unable to program the control register. In other words, any one of JTAG interface 202, CPU 204, arbitration logic 206, control register 184 or connections there between may have a bug. Therefore, programming path implementation 200 itself may not work properly.

Secondly, JTAG interface 202 halts CPU 204 once JTAG interface 202 is connected. This fundamentally changes the system of the behavior during debug. Specifically, there may be instances where the debugging test may want CPU 204 to operate.

Finally, each functional logic block requires a clock to operate, which may be a problem in the initial silicon.

What is needed is a functional debug path selection logic, which is independent of the operation of the main digital SoC and make the register selection automatic.

BRIEF SUMMARY

The present disclosure provides a system and method for a functional debug path selection logic, which is independent of the operation of the main digital SoC and make the register selection automatic.

In accordance with aspects of the present disclosure a device includes a plurality of functional logic blocks, a cascaded arrangement of multiplexers and a digital counter. Each of the plurality of functional logic blocks outputs signals corresponding to nodes to be tested therein. The cascaded arrangements of multiplexers are arranged such that any of the outputs from any of the plurality of functional logic blocks may be selected for output. The digital counter is operable to control the cascaded arrangement of multiplexers so as to output signals from the functional logic blocks based on a counted signal.

Additional advantages and novel features of the disclosure are set forth in part in the description which follows, and in part will become apparent to those skilled in the art upon examination of the following or may be learned by practice of the disclosure. The advantages of the disclosure may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present disclosure and, together with the description, serve to explain the principles of the disclosure. In the drawings.

DETAILED DESCRIPTION

Aspects of the disclosure are drawn to a system and method that enables observation of many signal values at any given time, which is completely independent of the operation of the main digital SoC. In the prior art case, the implementation required several steps before accessing the multiplexer control registers. In addition, pin limitation forces the designer to limit the bus width, which means only limited signals can be observed at any given time.

Figure 1:
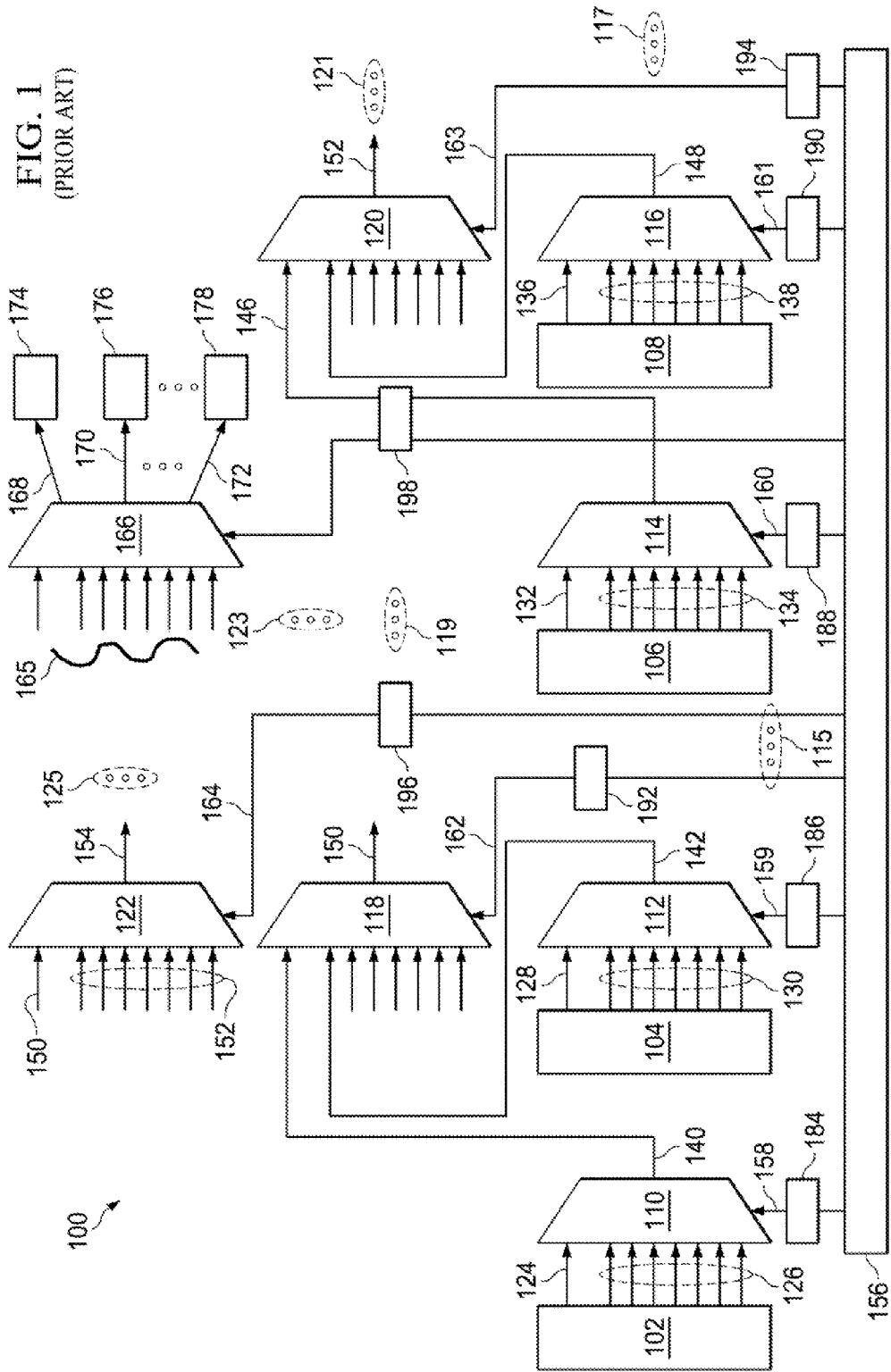
FIG. 1 illustrates a prior art debug logic implementation.

In one aspect, a cascaded arrangements of multiplexers that are similar to that in FIG. 1, are controlled by a counter. The counter counts through the number of inputs going into the multiplexer from the functional logic and serially outputs each onto an output line.

In another aspect, the counter-controlled automatic debug process is overridden so as to output a targeted input. The targeted input of a specific functional logic block output are controllable "steered" through the cascaded multiplexers.

Another aspect is drawn to the output or current state of the system being output to a serial flash drive interface, so the output can be stored to an external drive.

Another aspect is drawn to overriding the system clock with another clock to run the functional logic blocks one clock pulse at a time. Each individual clock pulse would output all of the functional logic block signals to the output, capturing the state of the system, within the clock pulse.

Figure 2:
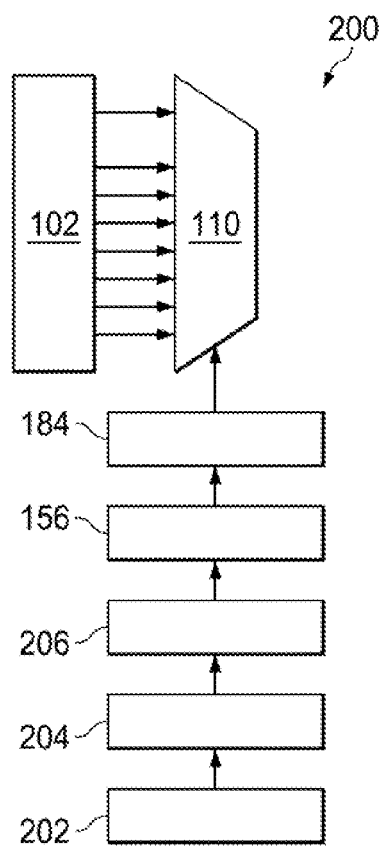
FIG. 2 illustrates a prior art programming path implementation.

All aspects of the present disclosure are performed without the use of the levels of logic blocks described in FIG. 2.

Aspects of the present disclosure will now be described with reference to FIGS. 3-5.

An implementation of the internal functional node probing mechanism in accordance with the present disclosure will now be described with reference to FIG. 3.

Figure 3:
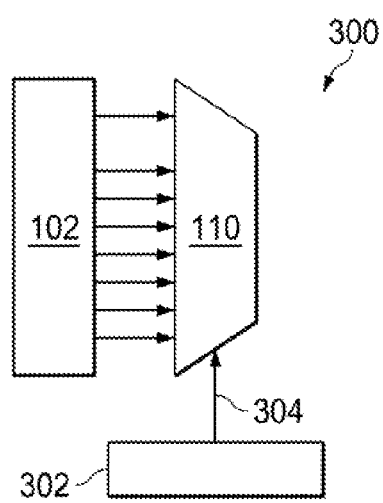
FIG. 3 illustrates a present programming path implementation in accordance with aspects of the present disclosure.

FIG. 3 illustrates a programming path implementation 300 in accordance with aspects of the present disclosure.

As shown, programming path implementation 300 includes functional logic block 102, first-level multiplexer 110, and a functional node probing mechanism 302.

In this embodiment, functional node probing mechanism 302 is seen going directly into first-level multiplexer 110 by way of output line 304. Prior art programming path implementation 200 includes several required stages to program a multiplexer control register, wherein each of the required stages may have their own bugs. However, in accordance with the present disclosure, such stages are removed such that direct access to programming the multiplexer is performed. In this sample embodiment, only one multiplexer is shown to illustrate the functional advantage of the present disclosure, but there can be N multiplexers per level and M levels of multiplexers.

Figure 4:
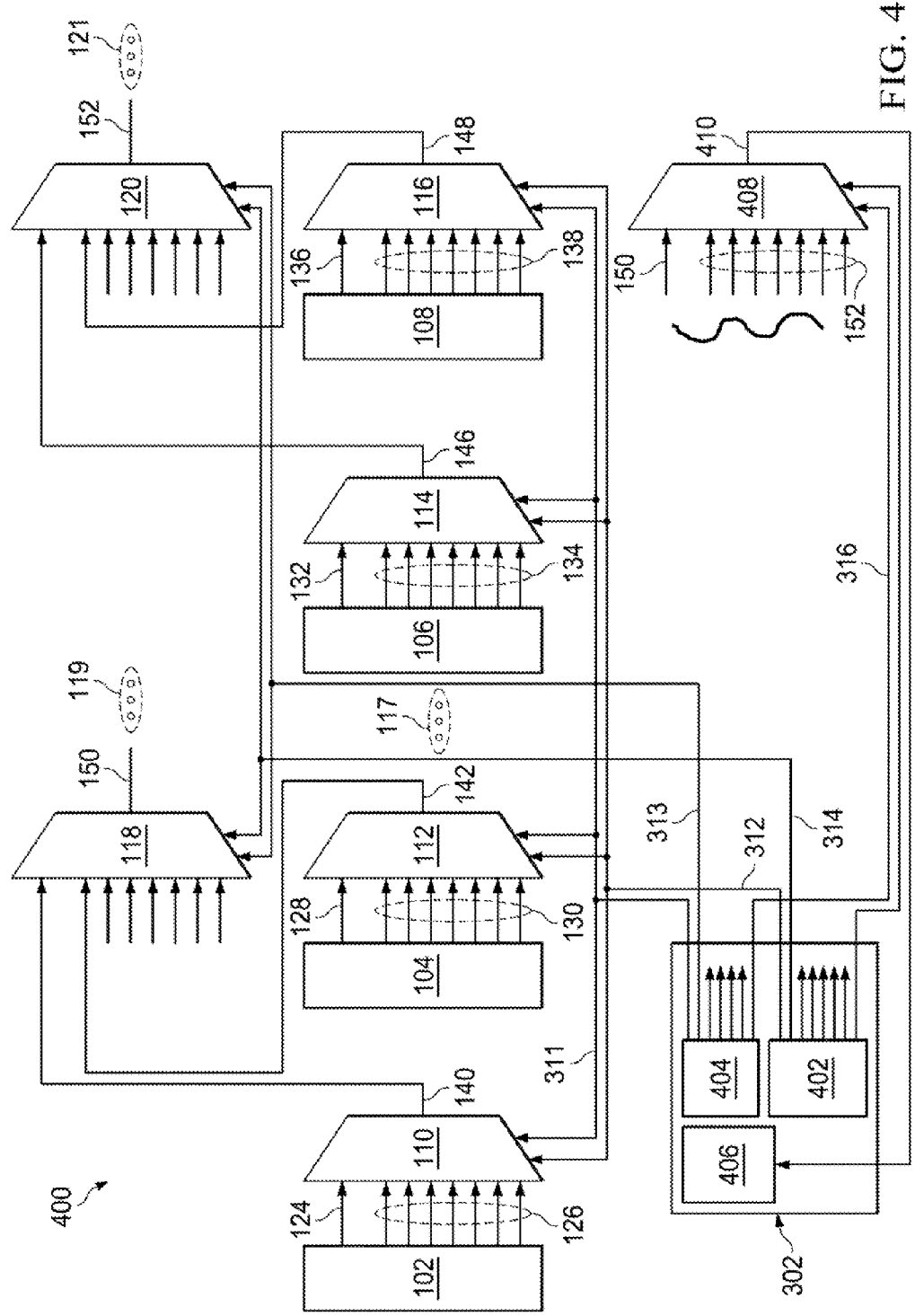
FIG. 4 illustrates a debug logic implementation with probing mechanism in accordance with aspects of the present disclosure.
Figure 5:
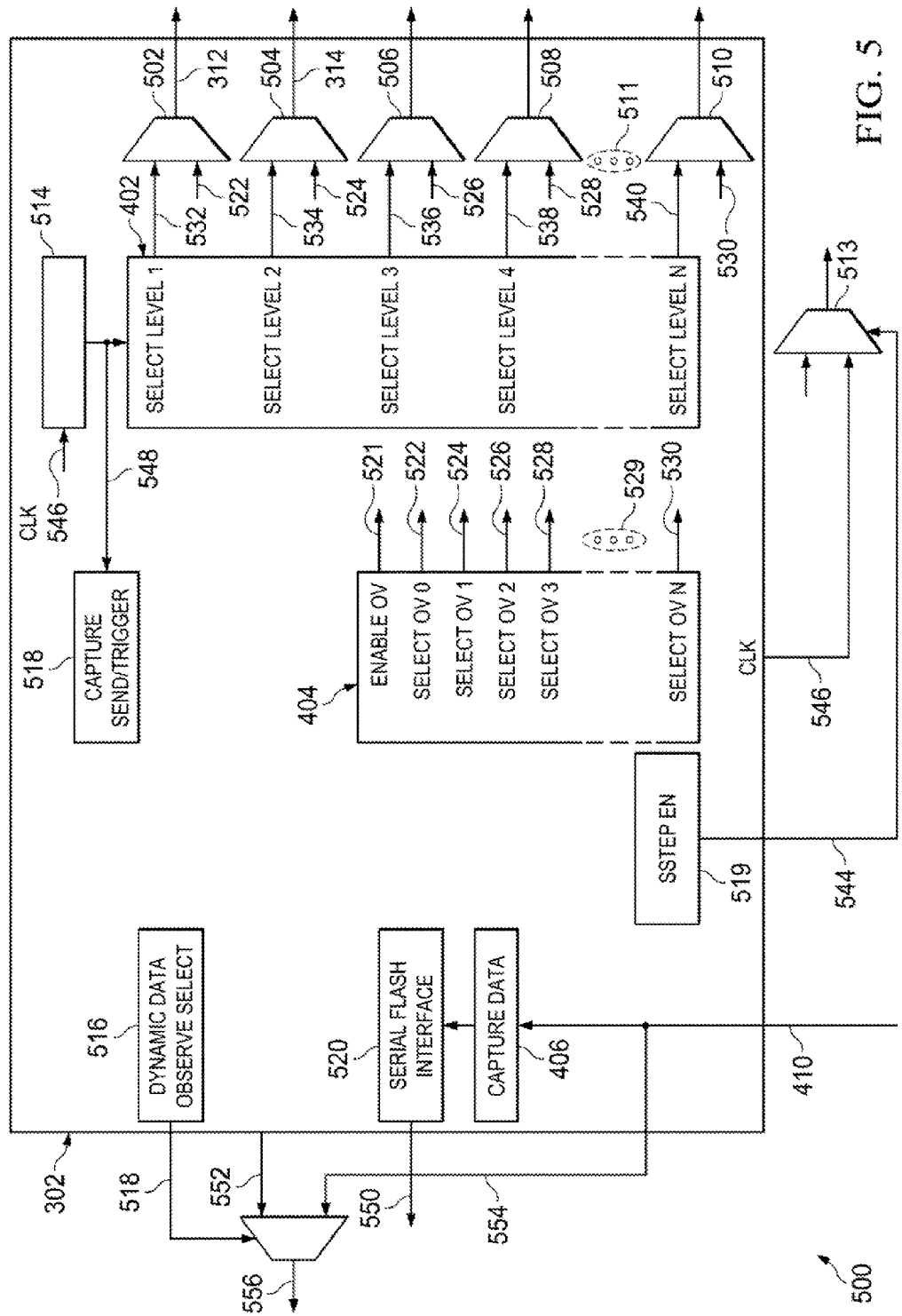
FIG. 5 illustrates an internal functional node probing mechanism in accordance with aspects of the present disclosure.

The device described in FIG. 3 will now be implemented into a sample embodiment and further described with references to FIGS. 4-5.

FIG. 4 illustrates a debug logic implementation with a probing system 400.

As shown in the figure, probing system 400 includes functional logic block 102, functional logic block 104, functional logic block 106, functional logic block 108, first-level multiplexer 110, first-level multiplexer 112, first-level multiplexer 114, first-level multiplexer 116, second-level multiplexer 118, second-level multiplexer 120, functional node probing mechanism 302, a digital counter 402, a controlling component 404, a capture data input 406, and a collecting multiplexer 408.

First-level multiplexer 110 is additionally arranged to receive data from either digital counter 402 or controlling component 404 by way of line 312. First-level multiplexer 112 is additionally arranged to receive data from either digital counter 402 or controlling component 404 by way of line 312. First-level multiplexer 114 is additionally arranged to receive data from either digital counter 402 or controlling component 404 by way of line 312. First-level multiplexer 116 is additionally arranged to receive data from either digital counter 402 or controlling component 404 by way of line 312. Items 117 and 119 are shown to indicate additional first-level multiplexers and functional logic components (not shown).

Second-level multiplexer 118 is additionally arranged to receive data from either digital counter 402 or controlling component 404 by way of line 314. Second-level multiplexer 118 is additionally arranged to output data by way of line 150 to collecting multiplexer 408. Second-level multiplexer 120 is additionally arranged to receive data from either digital counter 402 or controlling component 404 by way of line 314. Second-level multiplexer 120 is additionally arranged to output data by way of line 152 to collecting multiplexer 408. Items 119 and 121 are shown to indicate additional second-level multiplexers (not shown) to receive data from the first-level multiplexers.

Collecting multiplexer 408 is arranged to receive data by way of a plurality of input lines, a sample of which have been numbered 150 and 152. Collecting multiplexer 408 is additionally arranged to receive input data from either digital counter 402 or controlling component 404 by way of line 316. Collecting multiplexer 408 is also arranged to output data to capture data input 406 by way of line 410.

Similar to system 100 discussed above with reference to FIG. 1, in system 400 multiplexers in this example have 8 inputs. As such, 8 second-level multiplexers will feed a single third-level multiplexer (not shown), 8 third-level multiplexers (not shown) will feed a single fourth-level multiplexer (now shown), etc. An $n^{th}$-level multiplexer is "fed" by 8 $(n-1)^{th}$-level multiplexers. In this manner, the $n^{th}$-level multiplexer is responsible for outputting a signal corresponding to $8^n$ signals of functional logic blocks. In this example, the intermediate levels are not shown for purposes of brevity. In system 400, collecting multiplexer 408 is the $n^{th}$-level multiplexer.

In accordance with aspects of the present disclosure, the outputs from all the functional logic blocks are fed to the corresponding first-level multiplexers. Digital counter 402 cycles through a counting sequence to provide selection signals for all multiplexers. In this manner, all the outputs from all the functional logic blocks may be serially output from probing system 400.

In this example, digital counter 402 has 8 output lines, such that digital counter 402 may control 8 levels of multiplexers. It should be noted that this is a non-limiting example embodiment and aspects of the present disclosure may be implemented on any number of levels of multiplexers.

Similarly, in this example, controlling component 404 has 8 output lines, such that controlling component 404 may control 8 levels of multiplexers. It should be noted that this is a non-limiting example embodiment and aspects of the present disclosure may be implemented on any number of levels of multiplexers.

In this example, each multiplexer has 8 input lines, from eight output lines of a corresponding functional logic block. It should be noted that this is a non-limiting example embodiment and aspects of the present disclosure may be implemented with multiplexers having any number of input lines from a corresponding number of output lines of a corresponding functional logic block.

In operation, digital counter 402 automatically begins at a count of 1 and sends a select one enable signal by way of line 312 to the first level of multiplexers 110, 112, 114, and 116. The select signal instructs a receiving multiplexer as to which input signal to select as an output. When the select level signal is input as a count of 1, each receiving multiplexer will select the first input line as an output. In this example, for the illustrated first-level multiplexers, first-level multiplexer 110 will select the input signal on line 124, first-level multiplexer 112 will select the input signal on line 128, first-level multiplexer 114 will select the input signal on line 132, and first-level multiplexer 116 will select the input signal on line 136.

In this manner, the first input line for each first-level multiplexer is fed to the corresponding second-level multiplexer. In this example, for the illustrated first-level multiplexers and illustrated second-level multiplexers, the input signal on line 124 will be passed to the output by way of line 140 to the first input of second-level multiplexer 118 and the input signal on line 128 will be passed to the output by way of line 142 to the second input of second-level multiplexer 118. Similarly, input signals on line 132 and 136 will be passed to the output by way of lines 146 and 148, respectively, to the first and second inputs respectively, of second-level multiplexer 120.

Then, digital counter 402 begins at a count of 1 and sends a select one enable signal by way of line 314 to the second level of multiplexers, second-level multiplexer 118 and second-level multiplexer 120. The select signal instructs a receiving multiplexer as to which input signal to select as an output. When the select level signal is input as a count of 1, each receiving multiplexer will select the first input line as an output. In this example, for the illustrated second-level multiplexers, second-level multiplexer 118 will select the input signal on line 140 and second-level multiplexer 120 will select the input signal on line 146.

In this manner, the first input line for each second-level multiplexer is fed the corresponding third-level multiplexer.

This method of selecting the first input via an instruction from digital counter 402 is continued until the input at collecting multiplexer 408 correspond to the first inputs of each preceding level of multiplexer.

Then, digital counter 402 begins at a count of 1 and sends a select one enable signal by way of line 316 to collector multiplexer 408. The select signal instructs a receiving multiplexer as to which input signal to select as an output. When the select level signal is input as a count of 1, collector multiplexer 408 selects the signal on input line 150 as an output.

At this point, the input lines of the various levels of multiplexers are cycled through via digital counter 402 until all the signals from all the functional blocks are serially output from collector multiplexer via line 410.

For example, digital counter 402 counts from 2 through 8, by way of line 316 to collector multiplexer 408, such that collector multiplexer 408 serially outputs onto line 410, the signals on its remaining input lines.

Then, digital counter 402 counts to 2, by way of an output line to the $(n-1)^{th}$-level multiplexers. This instructs the $(n-1)^{th}$-level multiplexers to output the signal values on their respective second input lines at their respective output lines. These signals are received at the input lines of collector multiplexer 408. Then digital counter 402 counts from 1 through 8, by way of line 316 to collector multiplexer 408, such that collector multiplexer 408 serially outputs onto line 410, the signals on its input lines. Digital counter 402 then repeats this process by cycling through a incremental count, by way of an output line to the $(n-1)^{th}$-level multiplexers, and then cycling through a count of 1 through 8 of collector multiplexer 408 so as to serially output the remaining seven input signals from the $(n-1)^{th}$-level multiplexers.

The counting cycle discussed above is continued through all levels of multiplexers until all input signals from all functional logic blocks are serially output onto line 410.

There may be instances where not every signal from every functional block needs to be read. In fact, in some instances, there may only be a need to monitor specific outputs from specific functional blocks. This may be performed via controlling component 404.

Controlling component 404 overrides the automated digital counter by selecting, via a line 311 and a line 313, a specific output line from a specific functional logic block to be observed. For example, suppose that there is a need to monitor the node within functional logic block 104 which corresponds to output line 130. In such a case, a control signal on line 312 from controlling component 404 will instruct all first-level multiplexers, including first-level multiplexer 112, to select the signal on the second input line as the output. Then a control signal on line 314 from controlling component 404 will instruct all second-level multiplexers, including second-level multiplexer 118, to select the signal on the second input line as the output. This instruction sequence continues until the signal as originally output on line 130 from functional logic block 104 is output by collector multiplexer 408 onto line 410.

The system and method discussed above with reference to FIG. 4 enables a simple way to serially output all signals from all functional logic blocks via a counter. The system and method discussed above with reference to FIG. 4 additionally enables a simple way to output a specific signal from a specific functional logic block via a controller. The system and method discussed above with reference to FIG. 4 eliminates the possibility of bugs being introduced by the monitoring system that previously affected the prior art systems discussed above with reference to FIGS. 1-2. A more detailed embodiment will now be further described with reference to FIG. 5.

FIG. 5 illustrates an internal functional node probing mechanism 500.

As shown, FIG. 5 includes functional node probing mechanism 302, digital counter 402, controlling component 404, capture data input 406, counter multiplexers 502, 504, 506, 508, 510, and 513, an output multiplexer 512, a pre-scalar 514, a dynamic data observe select component 516, a capture send/trigger component 518, a SStep EN component 519, and a serial flash interface 520.

In this embodiment, the internal features of functional node probing mechanism 302 can be seen. In the following paragraphs, each component will be described.

The first component, as described in FIG. 4 is the digital counter 402. As mentioned before, the digital counter 402 can have N select levels, where N is the number of multiplexer levels. Referencing back to FIG. 4, digital counter 402 had three multiplexer levels. These three levels would apply to output lines 532, 534, and 536 in FIG. 5. Internally, the outputs of digital counter 402 are the first input to counter multiplexers 502, 504, and 506, respectively. The second input for each counter multiplexer comes from controlling component 404 outputs 522, 524, and 526, respectively. Counter multiplexers 502, 504, and 506 allow the user to override the automated debug process by sending an enable override signal to any of the counter multiplexers by way of line 521. For example, referring back to FIG. 4, if the user wants to observe input two on line 126, instead of the first input on line 124, enable override on line 521 will go to value 1 and have counter multiplexer 502 select input two to send to output on line 312.

The next component is output multiplexer 512. The output of this component on line 556 can be connected to a PC, and all the capture values from capture data input 406 can be seen by the PC's internal software. In addition, dynamic data observe select component 516 controls which input the output multiplexer 512 sends to the output. If this component remains at select zero, the data at capture data input 406 will continuously be sent to the output line 556. On the other hand, if the user wants to observe a specific point at the output, the user can send that signal to the input from controlling component 404 via line 552. Then dynamic data observe select component 516 can select the input on line 552 and pass to the output line 556.

Pre-scalar 514 allows the device to adjust the speed of the clock of the system in order to operate at optimal speed. For example, if the clock speed of the system under test is too high, pre-scalar 514 will lower the clock speed. Alternatively, if the clock speed of the system is slower than the rate at which the device can operate, the pre-scalar can increase the clock speed.

Serial flash interface 520 component allows the user to output the data captured to any memory device. One problem in prior art devices is there is no mechanism to store any data of a failed device. For example, if the processor gets stuck, prior art devices would fail and stay hung-up. In the present disclosure, the serial flash interface 520 component captures the failed state at that moment in time. Now the user can read the error and debug.

The final aspect of the device is the SSTEP enable component 519 as selected by capture send/trigger component 518. Capture sendtrigger component 518 receives a clock signal from pre-scalar 514 via line 548. With the clock signal, send/trigger component 518 is able to control SSETP enable component 519. SStep enable allows the user to send in a single clock pulse and capture the state of the system for one clock period. SStep enable will send an instruction to multiplexer 513 to input the device's clock by way of line 546. The clock signal on line 546 will be a single-period clock pulse (one rising edge and one falling edge). During each pulse, the digital counter 402 will output the entire system's current state to capture data input 406 by way of line 410.

The present disclosure described in FIGS. 3-5 develop a device that is fully automated, has no manual intervention, and can bring out the full functional state of the system without disturbing the system's operational state. In the prior art mechanism, the user would debug the system by using a JTAG interface. The drawback to using this interface is that the processor is halted when connected. This changes the systems behavior during debug. In addition, there are several modules the programming path takes before accessing a control register. Any link that fails between the JTAG interface and control register would render the path unusable. The functional node probing mechanism is completely independent of the operation of the system, removing the risk of affecting the functionality and behavior.

The foregoing description of various preferred embodiments of the disclosure have been presented for purposes of illustration and description. It is not intended to be exhaustive or to limit the disclosure to the precise forms disclosed, and obviously many modifications and variations are possible in light of the above teaching. The example embodiments, as described above, were chosen and described in order to best explain the principles of the disclosure and its practical application to thereby enable others skilled in the art to best utilize the disclosure in various embodiments and with various modifications as are suited to the particular use contemplated. It is intended that the scope of the disclosure be defined by the claims appended hereto.

What is claimed as new and desired to be protected by Letters Patent of the United States is:

1. A device comprising:
   a first functional logic block having a first functional block first output line and a first function block second output line;
   a second functional logic block having a second functional block first output line and a second function block second output line;
   a third functional logic block having a third functional block first output line and a third function block second output line;
   a fourth functional logic block having a fourth functional block first output line and a fourth function block second output line;
   a first level of multiplexers comprising a first first-level multiplexer, a second first-level multiplexer, a third first-level multiplexer and a fourth first-level multiplexer, the first first-level multiplexer comprising a first two selectable inputs and a first output, the second first-level multiplexer comprising a second two selectable inputs and a second output, the third first-level multiplexer comprising a third two selectable inputs and a third output, the fourth first-level multiplexer comprising a fourth two selectable inputs and a fourth output, one of the first two selectable inputs being connected to the first functional block first output line, the other of the first two selectable inputs being connected to the first function block second output line, one of the second two selectable inputs being connected to the second functional block first output line, the other of the second two selectable inputs being connected to the second function block second output line, one of the third two selectable inputs being connected to the third functional block first output line, the other of the third two selectable inputs being connected to the third function block second output line, one of the fourth two selectable inputs being connected to the fourth functional block first output line, the other of the fourth two selectable inputs being connected to the fourth function block second output line,
   a second level of multiplexers comprising a first second-level multiplexer and a second second-level multiplexer, the first second-level multiplexer comprising a fifth two selectable inputs and a fifth output, the second first-level multiplexer comprising a sixth two selectable inputs and a sixth output; and
   a digital counter comprising a first select output and a second select output, the first select output being operable to provide a first select signal to the first first-level multiplexer, to the second first-level multiplexer, to the third first-level multiplexer and to the fourth first-level multiplexer, the second select output being operable to provide a second select signal to the first second-level multiplexer and to the second second-level multiplexer.

2. The device of claim 1, including:
   a controlling component operable to output a select override signal to the first first-level multiplexer,
   in which the first first-level multiplexer is operable to output, based on the select override signal, a signal from one of the first two selectable inputs as an output signal on the first output.

3. The device of claim 2, including:
   a collecting multiplexer comprising a first selectable collecting input, a second selectable collecting input and a capture output, the first selectable collecting input being connected to the fifth output, the second selectable collecting input being connected to the sixth output, in which the digital counter further includes a third select output being operable to provide a third select signal to the collecting multiplexer.

4. The device of claim 3, in which the controlling component further includes a capture data input connected to the capture output.

5. The device of claim 4, including an output multiplexer comprising a captured data input, a selected data input and a final output.

6. The device of claim 1, including:

a collecting multiplexer comprising a first selectable collecting input, a second selectable collecting input and a capture output, the first selectable collecting input being connected to the fifth output, the second selectable collecting input being connected to the sixth output, in which the digital counter further includes a third select output being operable to provide a third select signal to the collecting multiplexer.

7. The device of claim 6, in which the controlling component further includes a capture data input connected to the capture output.

8. The device of claim 7, including an output multiplexer comprising a captured data input, a selected data input and a final output.

9. The device of claim 1, in which the controlling component further includes a capture data input connected to the capture output.

10. The device of claim 1, including an output multiplexer comprising a captured data input, a selected data input and a final output.

11. A method comprising:

providing a first functional logic block having a first functional block first output line and a first function block second output line;

providing a second functional logic block having a second functional block first output line and a second function block second output line, providing a from a third functional logic block having a third functional block first output line and a third function block second output line;

providing a fourth functional logic block having a fourth functional block first output line and a fourth function block second output line;

providing a first level of multiplexers comprising a first first-level multiplexer, a second first-level multiplexer, a third first-level multiplexer and a fourth first-level multiplexer, the first first-level multiplexer comprising a first two selectable inputs and a first output, the second first-level multiplexer comprising a second two selectable inputs and a second output, the third first-level multiplexer comprising a third two selectable inputs and a third output, the fourth first-level multiplexer comprising a fourth two selectable inputs and a fourth output, one of the first two selectable inputs being connected to the first functional block first output line, the other of the first two selectable inputs being connected to the first function block second output line, one of the second two selectable inputs being connected to the second functional block first output line, the other of the second two selectable inputs being connected to the second function block second output line, one of the third two selectable inputs being connected to the third functional block first output line, the other of the third two selectable inputs being connected to the third function block second output line, one of the fourth two selectable inputs being connected to the fourth functional block first output line, the other of the fourth two selectable inputs being connected to the fourth function block second output line, providing a second level of multiplexers comprising a first second-level multiplexer and a second second-level multiplexer, the first second-level multiplexer comprising a fifth two selectable inputs and a fifth output, the second first-level multiplexer comprising a sixth two selectable inputs and a sixth output;

providing, via a first select output of a digital counter, a first select signal to the first first-level multiplexer, to the second first-level multiplexer, to the third first-level multiplexer and to the fourth first-level multiplexer; and providing, via a second select output of the digital counter, a second select signal to the first second-level multiplexer and to the second second-level multiplexer.

12. The method of claim 11, including:

outputting, via a controlling component, a select override signal to the first first-level multiplexer; and outputting, via first first-level multiplexer, based on the select override signal, a signal from one of the first two selectable inputs as an output signal on the first output.

13. The method of claim 12, including:

providing a collecting multiplexer comprising a first selectable collecting input, a second selectable collecting input and a capture output, the first selectable collecting input being connected to the fifth output, the second selectable collecting input being connected to the sixth output; and providing, via a third select output of the digital counter, a third select signal to the collecting multiplexer.

14. The method of claim 13, including providing a capture data input of the controlling component connected to the capture output.

15. The method of claim 14, including providing an output multiplexer comprising a captured data input, a selected data input and a final output.

16. The method of claim 11, including:

providing a collecting multiplexer comprising a first selectable collecting input, a second selectable collecting input and a capture output, the first selectable collecting input being connected to the fifth output, the second selectable collecting input being connected to the sixth output; and providing, via a third select output of the digital counter, a third select signal to the collecting multiplexer.

17. The method of claim 16, including providing a capture data input of the controlling component connected to the capture output.

18. The method of claim 17, including providing an output multiplexer comprising a captured data input, a selected data input and a final output.

19. The method of claim 11, including providing a capture data input of the controlling component connected to the capture output.

20. The method of claim 11, including providing an output multiplexer comprising a captured data input, a selected data input and a final output.

* * * * *